(12) United States Patent
Zhou (10) Patent No.: US 11,758,815 B2
(45) Date of Patent: Sep. 12, 2023

(54) SEMICONDUCTOR MODULE INCLUDING PIEZOELECTRIC LAYER AND METHOD FOR MANUFACTURING THE SAME

(71) Applicant: UNITED MICROELECTRONICS CORP., Hsinchu (TW)

(72) Inventor: Zhi-Biao Zhou, Singapore (SG)

(73) Assignee: UNITED MICROELECTRONICS CORP., Hsinchu (TW)

( * ) Notice: Subject to any disclaimer, the term of this patent is extended or adjusted under 35 U.S.C. 154(b) by 203 days.

(21) Appl. No.: 17/022,150

(22) Filed: Sep. 16, 2020

(65) Prior Publication Data

US 2022/0045264 A1    Feb. 10, 2022

(30) Foreign Application Priority Data

Aug. 6, 2020    (CN) .......................... 202010781779.0

(51) Int. Cl.
*H10N 30/05*    (2023.01)
*H10N 30/072*    (2023.01)
*H10N 30/80*    (2023.01)

(52) U.S. Cl.
CPC .......... *H10N 30/05* (2023.02); *H10N 30/072* (2023.02); *H10N 30/80* (2023.02)

(58) Field of Classification Search
CPC ..... H01L 41/04; H01L 27/20; H03H 9/02574; H03H 9/02913; H03H 9/15
See application file for complete search history.

(56) References Cited

U.S. PATENT DOCUMENTS

| | | | | |
|---|---|---|---|---|
| 4,628,490 A | * | 12/1986 | Kramer | G10K 11/165 367/1 |
| 4,758,896 A | * | 7/1988 | Ito | H04N 5/44 348/790 |
| 5,481,915 A | * | 1/1996 | Tabota | G01P 15/0915 73/514.34 |
| 9,556,321 B2 | * | 1/2017 | Curry | C04B 35/4682 |
| 10,141,912 B2 | * | 11/2018 | Hurwitz | H01L 24/13 |
| 10,389,331 B2 | | 8/2019 | Hurwitz | |
| 2002/0171508 A1 | | 11/2002 | Harada et al. | |
| 2004/0173816 A1 | * | 9/2004 | Saxler | H03H 9/02574 257/195 |
| 2009/0091904 A1 | * | 4/2009 | Hatanaka | H03H 9/0542 361/764 |
| 2009/0218912 A1 | * | 9/2009 | Abd Allah | H03H 9/175 310/321 |
| 2012/0133001 A1 | * | 5/2012 | Tkaczyk | H01L 27/20 438/66 |

(Continued)

FOREIGN PATENT DOCUMENTS

EP    3474447 A1 *    4/2019    ............... H03H 3/10

OTHER PUBLICATIONS phsyics.nist.gov (https://physics.nist.gov/PhysRefData/XrayMassCoef/tab1.html) and (https://physics.nist.gov/cgi-bin/Star/compos.pl?ap245).*

*Primary Examiner* — Jeffrey T Carley
(74) *Attorney, Agent, or Firm* — WPAT, P.C (57) ABSTRACT

A semiconductor module and a method for manufacturing the same are provided. The semiconductor module includes a substrate comprising a front side and at least one semiconductor device formed on the front side, a shielding structure formed on the at least one semiconductor device, and a piezoelectric layer formed on the shielding structure.

11 Claims, 9 Drawing Sheets

(56) References Cited

U.S. PATENT DOCUMENTS

| | | | |
|---|---|---|---|
| 2014/0219063 A1* | 8/2014 | Hajati | B25J 9/104 |
| | | | 310/334 |
| 2015/0173237 A1* | 6/2015 | Lin | H05K 9/0026 |
| | | | 361/736 |
| 2016/0011722 A1* | 1/2016 | Lin | G06F 3/04146 |
| | | | 345/174 |
| 2017/0207214 A1* | 7/2017 | Or-Bach | H01L 27/0694 |
| 2018/0331156 A1* | 11/2018 | Then | H03H 9/562 |
| 2019/0097599 A1* | 3/2019 | Taniguchi | H01L 41/183 |
| 2019/0273116 A1* | 9/2019 | Goktepeli | B81C 1/00246 |
| 2020/0152697 A1* | 5/2020 | Qian | H10N 30/06 |

* cited by examiner

SEMICONDUCTOR MODULE INCLUDING PIEZOELECTRIC LAYER AND METHOD FOR MANUFACTURING THE SAME

This application claims the benefit of People's Republic of China application Serial No. 202010781779.0, filed Aug. 6, 2020, the subject matter of which is incorporated herein by reference.

BACKGROUND

Technical Field

The disclosure relates to a semiconductor module and a method for manufacturing the same, and more particularly to a semiconductor module including a piezoelectric layer and a method for manufacturing the same.

Description of the Related Art

A conventional stacked semiconductor device is usually manufactured by stacking semiconductor elements and interconnecting the semiconductor elements using bonding technology. Common bonding technology includes wire bonding, flip chip and through silicon via (TSV).

Wire bonding is the method of making interconnections between, for instance, a chip and a lead frame or an external circuit by metal wires. Wire bonding can be categorized into different types, such as wedge bonding or ball bonding, by the shape of the end of the bonding wire. Flip chip is the method of making interconnections by flipping over chips and interconnecting the chips to a substrate with solder bumps that have been deposited onto the chip pads. Through silicon via is the method of making interconnections between vertically stacked semiconductor elements by vias that pass through a chip and conductive materials filled in the vias.

Take front end modules (FEM) as an example. A front end module may be manufactured by the following steps: manufacturing a surface acoustic wave (SAW) filter and an integrated circuit (IC) substrate in different processes, and stacking the SAW filter on the IC substrate, and then using bonding technology, such as wire bonding, flip chip or through silicon via (TSV), to make interconnections between the SAW filter and the IC substrate. However, conventional bonding technology faces several challenges, for instance, alignment accuracy, stability of the bonding wires, and additional bonding processes lead to poor controllability of individual semiconductor element, such as SAW filter, high production cost, low integration and performance of the semiconductor device.

SUMMARY

The present disclosure relates to a semiconductor module and a method for manufacturing the same.

According to an embodiment of the present disclosure, a semiconductor module is provided. The semiconductor module includes a substrate, a shielding structure and a piezoelectric layer. The substrate includes a front side and at least one semiconductor element formed on the front side. The shielding structure is formed on the at least one semiconductor element. The piezoelectric layer is formed on the shielding structure.

According to another embodiment of the present disclosure, a method for manufacturing a semiconductor module is provided. The method includes the following steps: providing a substrate, wherein the substrate includes a front side and at least one semiconductor element formed on the front side; forming a shielding structure on the at least one semiconductor element; forming a piezoelectric layer on the shielding structure.

The above and other embodiments of the disclosure will become better understood with regard to the following detailed description of the non-limiting embodiment(s). The following description is made with reference to the accompanying drawings.

DETAILED DESCRIPTION

In the embodiments of the present disclosure, a semiconductor module and a method for manufacturing the same are provided. The semiconductor module comprises a substrate, a shielding structure and a piezoelectric layer. The substrate comprises a front side and at least one semiconductor element formed on the front side. The shielding structure is formed on the at least one semiconductor element. The piezoelectric layer is formed on the shielding structure. With such configuration, the semiconductor module can be formed without using an additional bonding process, thereby improving the controllability, integration and performance of the semiconductor module.

Various embodiments will be described more fully hereinafter with reference to accompanying drawings, which are provided for illustrative and explaining purposes rather than a limiting purpose. For clarity, the components may not be drawn to scale. In addition, some components and/or reference numerals may be omitted from some drawings. It is contemplated that the elements and features of one embodiment can be beneficially incorporated in another embodiment without further recitation.

Moreover, use of ordinal terms such as "first", "second", "third", etc., in the specification and claims to modify an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements. Also, the terms for describing spatial relationship between two elements/features, such as "beneath", "below", "lower", "upper", "above", "on", etc., can be referred to the spatial relationship between one element/feature and another element/feature, unless specially defined. It will be apparent to those skilled in the art that those spatially-related terms include not only the configuration/position of the elements as shown in the figures, but also the configuration/position of the elements in the use or operation. Therefore, the terms in the specification and claims are used for describing the embodiments, and are not intended to limit the scope of the disclosure. Additionally, the identical and/or similar elements of the embodiments are designated with the same and/or similar reference numerals for clear illustration.

Figure 1:
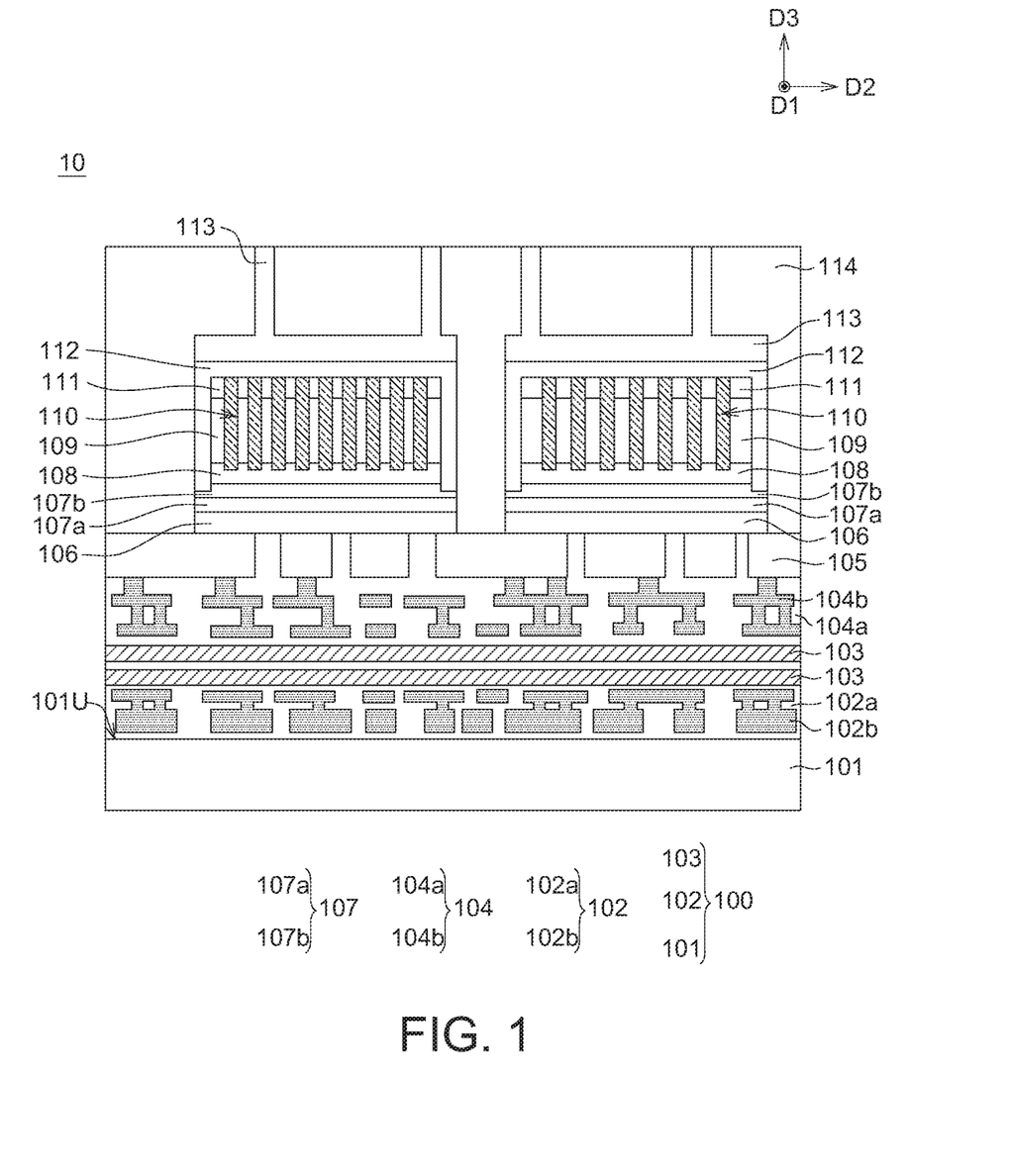
FIG. 1 illustrates a schematic view of a semiconductor module according to an embodiment of the present disclosure.

FIG. 1 illustrates a schematic view of a semiconductor module 10 according to an embodiment of the present disclosure. The semiconductor module 10 includes a substrate 100, a shielding structure 107 and a piezoelectric layer 109. The substrate 100 includes at least one semiconductor element 103 formed on a front side of the substrate 100. The shielding structure 107 is formed on the semiconductor element 103. The piezoelectric layer 109 is formed on the shielding structure 107.

In an embodiment, the substrate 100 may include a supporting piece 101, a first circuit layer 102 and semiconductor elements 103. The supporting piece 101 is provided in a plane determined by a first direction D1 and a second direction D2. An upper surface 101U of the supporting piece 101 is perpendicular to a third direction D3. The first direction D1, the second direction D2 and the third direction D3 are perpendicular to each other. The semiconductor elements 103 are formed on the upper surface 101U of the supporting piece 101. The first circuit layer 102 is disposed between the semiconductor elements 103 and the upper surface 101U of the supporting piece 101 so as to provide electrical connections between the semiconductor elements 103 and the supporting piece 101.

In an embodiment, the front side of the substrate 100 may be understood as a side of the substrate 100 where an integrated circuit is disposed. The front side of the substrate 100 is opposite to a rear side of the substrate 100, and the rear side of the substrate 100 is provided without an integrated circuit. In other words, the front side of the substrate 100 and the upper surface 101U of the supporting piece 101 may face the same direction. In an embodiment, the supporting piece 101 may be a handling wafer or a substrate containing silicon, such as a silicon-on-insulator (SOI) substrate.

In an embodiment, the first circuit layer 102 may include an interlayer dielectric (ILD) material 102a. In an embodiment, a metal interconnection 102b is formed in the interlayer dielectric material 102a by wire routing technology to form the first circuit layer 102. In an embodiment, the first circuit layer 102 may include a redistribution layer (RDL).

The semiconductor element 103 may be a radio frequency (RF) front end element used in wireless communication. For example, in an embodiment, the semiconductor element 103 may be a functional substrate having embedded inductors, wires and couplers. In another embodiment, the semiconductor element 103 may be a front end module (FEM) that may be integrated with controllers, power amplifiers and other semiconductor switches on an integrated circuit substrate.

The shielding structure 107 may be formed above the semiconductor elements 103. Specifically, the shielding structure 107 is formed above the semiconductor elements 103 along the third direction D3, and the shielding structure 107 and the supporting piece 101 are disposed on opposite sides of the semiconductor elements 103. The semiconductor module 10 may include a second circuit layer 104 and a metal layer 105 disposed between the shielding structure 107 and the semiconductor elements 103. The metal layer 105 may be a metal pad with a thickness in the nanoscale.

In an embodiment, the metal layer 105 may have a thickness ranging from 0.5 micrometers (μM) to 1 millimeters (mm).

The second circuit layer 104 may be disposed between the metal layer 105 and the semiconductor elements 103 so as to provide electrical connections between the metal layer 105 and the semiconductor elements 103. In an embodiment, the second circuit layer 104 is similar to the first circuit layer 102. The second circuit layer 104 may include an interlayer dielectric material 104a and a metal interconnection 104b. In another embodiment, the second circuit layer 104 may include a redistribution layer.

In an embodiment, the shielding structure 107 may be made of a dielectric material or a magnetic material. For example, the magnetic material may include ferrite, soft magnetic material and so on. Soft magnetic material may include Fe, Co, Ni or an alloy thereof. In another embodiment, the shielding structure 107 may be made of SIN, a low dielectric constant material, $HfO_x$, $SiO_2$, AlN, $Al_2O_3$, ZnO, lead zirconate titanate (PZT), $LiTaO_3$, $LiNbO_3$ or $Fe_3O_4$. However, the present disclosure is not limited to the material of the shielding structure 107.

In this embodiment, the shielding structure 107 may include a first shielding layer 107a having a first density and a second shielding layer 107b having a second density. The first shielding layer 107a is stacked on the semiconductor elements 103 in the third direction D3. The second shielding layer 107b is stacked on the first shielding layer 107a in the third direction D3. In an embodiment, the first density of the first shielding layer 107a is greater than the second density of the second shielding layer 107b. In another embodiment, the first shielding layer 107a is less than the second density of the second shielding layer 107b.

Specifically, the first shielding layer 107a and the second shielding layer 107b may be laminated to form the shielding structure 107 with a laminated structure in a lamination process. The lamination process can improve the strength and stability of the shielding structure 107. The greater the difference between the first density of the first shielding layer 107a and the second density of the second shielding layer 107b, the better the performance of the semiconductor module 10. For example, the first density of the first shielding layer 107a may be approaching zero, the second density of the second shielding layer 107b may be approaching a density of Tungsten (the density of Tungsten is about 19.35 $g/cm^3$), and vice versa.

For example, the first shielding layer 107a may include a high dielectric constant material (high-k material), the second shielding layer 107b may include a low dielectric constant material (low-k material), and vice versa. The high dielectric constant material and the low dielectric constant material may be selected from those known in the art. For example, the low dielectric constant material may include SiN, $SiO_2$, fluorinated silicate glass (FSG), an ultra-low-k material (ULK) or nitrogen doped carbide (NDC). The high dielectric constant material may include $HfO_2$, $AlO_x$, $ZrO_2$, $La_2O_3$ or any other suitable material.

Although the shielding structure 107 described above may have a double layer structure, the shielding structure 107 may further include a third shielding layer (not shown) stacked on the second shielding layer 107b in the third direction D3 in another embodiment. The third shielding layer may include a material the same as or different from the material of the first shielding layer 107a and/or the second shielding layer 107b. The third shielding layer has a third density different from the second density of the second shielding layer 107b adjacent to the third shielding layer, but the third density of the third shielding layer may be the same as or different from the first density of the first shielding layer 107a.

In an embodiment, the semiconductor module 10 may include a first buffer layer 106 disposed between the metal layer 105 and the shielding structure 107. In other words, the first buffer layer 106 is formed between the shielding structure 107 and the semiconductor elements 103. In an embodiment, the first buffer layer 106 may include, but not limited to, oxide, nitrogen oxide or carbon nitride. For example, the first buffer layer 106 may include silicon oxynitride (SiON) or silicon carbonitride (SiCN). In an embodiment, the first buffer layer 106 may increase the heat dissipation efficiency of the semiconductor module 10. In an embodiment, the first buffer layer 106 may improve the interfacial compatibility between elements in different layers; for example, the first buffer layer 106 may improve the interfacial compatibility between the metal layer 105 and the shielding structure 107 so that the metal layer 105 and the shielding structure 107 can be connected stably to each other.

The piezoelectric layer 109 may be formed on the shielding structure 107. Specifically, in the third direction D3, the piezoelectric layer 109 may be formed on the shielding structure 107, and the piezoelectric layer 109 and the semiconductor elements 103 may be disposed on opposite sides of the shielding structure 107. The piezoelectric layer 109 may be made of a piezoelectric material. The piezoelectric material may include piezoelectric crystal, such as piezoelectric single crystal or piezoelectric polycrystal, piezoelectric polymer, or piezoelectric composite material. Specifically, the piezoelectric material may include AlN, quartz, $LiTaO_3$, $LiNbO_3$, ceramics, lead zirconate titanate (PZT), polyvinylidene fluoride (PVDF) and copolymers thereof, polyvinyl chloride (PVC), a composite material made from ceramics and polymers, or any other suitable piezoelectric material.

In this embodiment, the piezoelectric layer 109 is formed on the shielding structure 107 directly without using an additional bonding process to accomplish the connection between the piezoelectric layer 109 and the shielding structure 107. That is to say, the piezoelectric layer 109 may be integrated into the semiconductor module 10 without an additional welding process or solder bumps or vias for connecting. Therefore, the reliability of the semiconductor module 10 will not be decreased due to poor alignment accuracy or unstable quality of the bonding wires, and the controllability of the piezoelectric layer 109 can also be increased. In other words, the problems in the prior art that elements are difficult to be well controlled, resulting from using a bonding process to connect elements, can be solved by the present disclosure. Also, the consistency, integration and performance of the semiconductor module 10 can be improved by the present disclosure.

As shown in FIG. 1, the semiconductor module 10 may include a conductive structure 110 embedded in the piezoelectric layer 109. The conductive structure 110 may pass completely through the piezoelectric layer 109 (i.e. from an upper surface to a lower surface) in the third direction D3. In this embodiment, the conductive structure 110 may include interdigitated electrodes 210/211 extending along the third direction D3. The interdigitated electrodes 210/211 are arranged apart from each other in the piezoelectric layer 109 along the second direction D2.

Figure 2A:
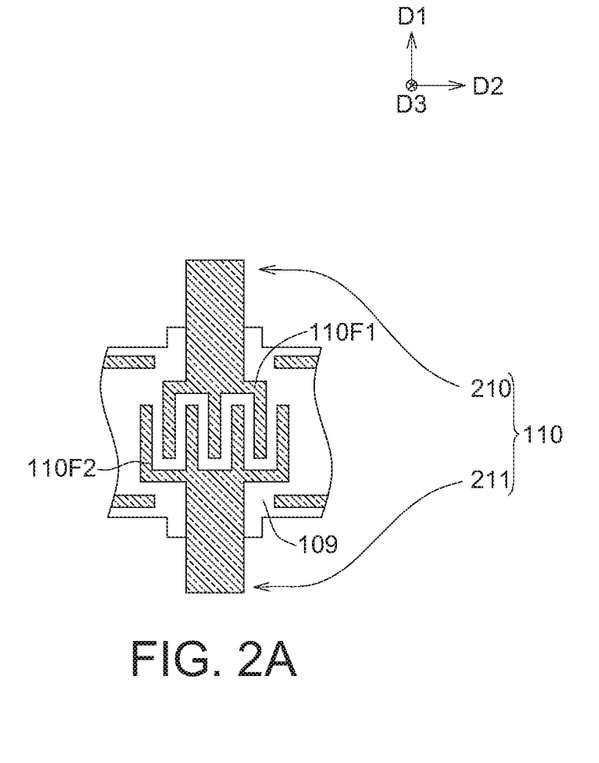
FIG. 2A illustrates a schematic top view of a conductive structure according to an embodiment of the present disclosure.

For example, referring to FIG. 2A, FIG. 2A illustrates a schematic top view of the conductive structure 110 shown in FIG. 1. In this embodiment, the conductive structure 110 includes at least one set of the interdigitated electrodes 210/211 disposed in the piezoelectric layer 109, wherein the interdigitated electrode 210 includes conductive fingers 110F1 connected to each other, the interdigitated electrode 211 includes conductive fingers 110F2 connected to each other. The interdigitated electrode 210 and the interdigitated electrode 211 are arranged apart from each other in a plane determined by the first direction D1 and the second direction D2, and the conductive fingers 110F1 of the interdigitated electrode 210 and the conductive fingers 110F2 of the interdigitated electrode 211 are arranged apart from each other. The interdigitated electrodes 210/211 of the conductive structure 110 may be arranged to form a metal oxide metal capacitor (MOM CAP).

In an embodiment, the set of the interdigitated electrodes 210/211 of the conductive structure 110 may form an interdigital transducer (IDT). In other words, the conductive structure 110 may include an interdigital transducer. In this case, the conductive structure 110 and the piezoelectric layer 109 may be functioned as a filter, such as a SAW filter. When the conductive structure 110 and the piezoelectric layer 109 is functioned as a filter, the set of the interdigitated electrodes 210/211 of the conductive structure 110 may be input electrode and output electrode respectively.

In another embodiment, the set of the interdigitated electrodes 210/211 of the conductive structure 110 may include different configurations so as to form different types of filter, such as a transverse filter, a multistrip coupler filter, an interdigitated interdigital transducer, a double-mode filter and so on. In addition, the semiconductor module 10 may further include a resonant circuit to decrease the insertion loss of the filter.

Figure 2B:
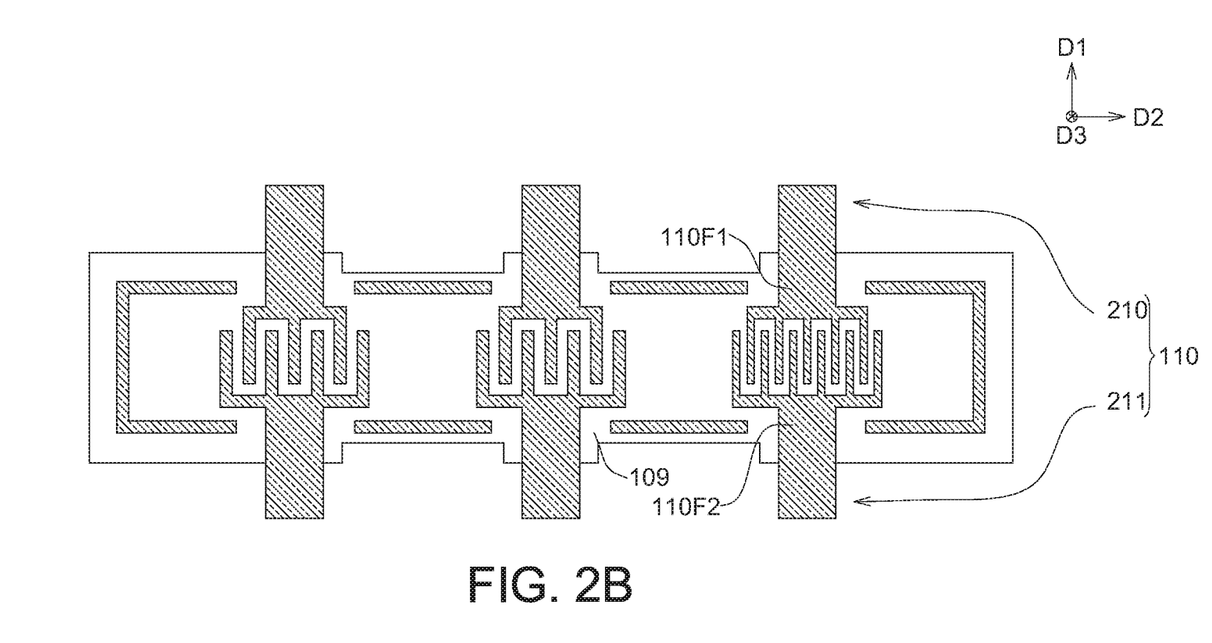
FIG. 2B illustrates a schematic top view of a conductive structure according to an embodiment of the present disclosure.

It should be noted that the conductive structure 110 may have another configurations. While the interdigitated electrodes 210/211 passes through the piezoelectric layer 109 along the third direction D3 in the embodiment shown in FIG. 2A, the conductive structure 110 may be merely disposed on the upper surface of the piezoelectric layer 109 in another embodiment. FIG. 2A merely shows one set of the interdigitated electrodes 210/211, the interdigitated electrode 210 includes three conductive fingers 110F1, and the interdigitated electrode 211 includes four conductive fingers 110F2. However, the conductive structure 110 may include multiple sets of the interdigitated electrodes 210/211 (for example, in FIG. 2B, the conductive structure 110 include three sets of the interdigitated electrodes 210/211), and the present disclose is not intended to limit the number of the conductive fingers 110F1/110F2. In other embodiments, the number of the conductive fingers 110F1/110F2 may be increased or decreased according to the design of the semiconductor module 10.

In an embodiment, the semiconductor module 10 may include a second buffer layer 108 disposed on the shielding structure 107. As shown in FIG. 1, in the third direction D3, the first buffer layer 106 and the second buffer layer 108 may be disposed on opposite sides of the shielding structure 107. In other words, the second buffer layer 108 is formed between the shielding structure 107 and the piezoelectric layer 109. In an embodiment, the second buffer layer 108 may include, but not limited to, oxide, nitrogen oxide or carbon nitride. For example, the second buffer layer 108 may include silicon oxynitride (SiON) or silicon carbonitride (SiCN). In an embodiment, the second buffer layer 108 and the first buffer layer 106 may include the same material or may be made of the same material.

In an embodiment, the second buffer layer 108 may absorb the electromagnetic wave in the semiconductor module 10. In an embodiment, the second buffer layer 108 may improve the interfacial compatibility between elements in different layers; for example, the second buffer layer 108 may improve the interfacial compatibility between the shielding structure 107 and the piezoelectric layer 109 so that the shielding structure 107 and the piezoelectric layer 109 can be connected stably to each other.

The semiconductor module 10 may include a first protecting layer 111 disposed on the piezoelectric layer 109. In an embodiment, the first protecting layer 111 is disposed on the upper surface of the piezoelectric layer 109; the second buffer layer 108 is disposed on the lower surface of the piezoelectric layer 109; the conductive structure 110 passes through the first protecting layer 111, the piezoelectric layer 109 and the second buffer layer 108 along the third direction D3; lower ends of the conductive structure 110 in the third direction D3 is disposed in the second buffer layer 108.

The semiconductor module 10 may include a second protecting layer 112 disposed on the first protecting layer 111. In an embodiment, the second protecting layer 112 is disposed on an upper surface of the first protecting layer 111 and sidewalls of the first protecting layer 111, the piezoelectric layer 109 and the second buffer layer 108. In an embodiment, the second protecting layer 112 is disposed on part of upper surface and part of sidewall of the shielding structure 107.

In an embodiment, the first protecting layer 111 and the second protecting layer 112 may include the same or different materials. In an embodiment, the first protecting layer 111 and the second protecting layer 112 may include dielectric materials. In an embodiment, the first protecting layer 111 and the second protecting layer 112 may include materials compatible with the complementary metal-oxide-semiconductor (CMOS) process in the art, such as nitride, oxide or ceramic material. In an embodiment, the first protecting layer 111 and the second protecting layer 112 may include SiN.

In an embodiment, the first protecting layer 111 and the second protecting layer 112 may increase the stiffness of the semiconductor module 10.

The semiconductor module 10 may include an oxide structure 113 disposed on the protecting layer 112.

The semiconductor module 10 may include a contact structure 114. In an embodiment, the contact structure 114 is disposed on an upper surface of the metal layer 105 so as to provide electrical connections between the metal layer 105 and other circuits or elements (not shown).

In an embodiment, when the conductive structure 110 and the piezoelectric layer 109 is functioned as a SAW filter, the shielding structure 107 may increase the signal, the first protecting layer 111 and the second protecting layer 112 may improve the performance of the SAW filter, the metal layer 105 may be used to dissipate heat and prevent the heat generated by the SAW filter from transferring to a region between the metal layer 105 and the supporting piece 101. For example, the metal layer 105 may be used to prevent the heat generated by the SAW filter from transferring to the semiconductor elements 103. The first protecting layer 111 may increase the stiffness of the SAW filter, and improve the performance of the SAW filter, such as the performance of the SAW filter at high frequency. Two SAW filters may be electrically isolated from each other by the second protecting layer 112, or two SAW filters may be electrically isolated from the contact structure 114 by the second protecting layer 112. In an embodiment, the semiconductor module 10 may include a temperature detecting circuit (not shown) and/or a temperature compensation circuit so as to prevent the stability of the SAW filter from being decreased with temperature. In an embodiment, the semiconductor elements 103 may include a temperature detecting circuit (not shown).

Figure 3:
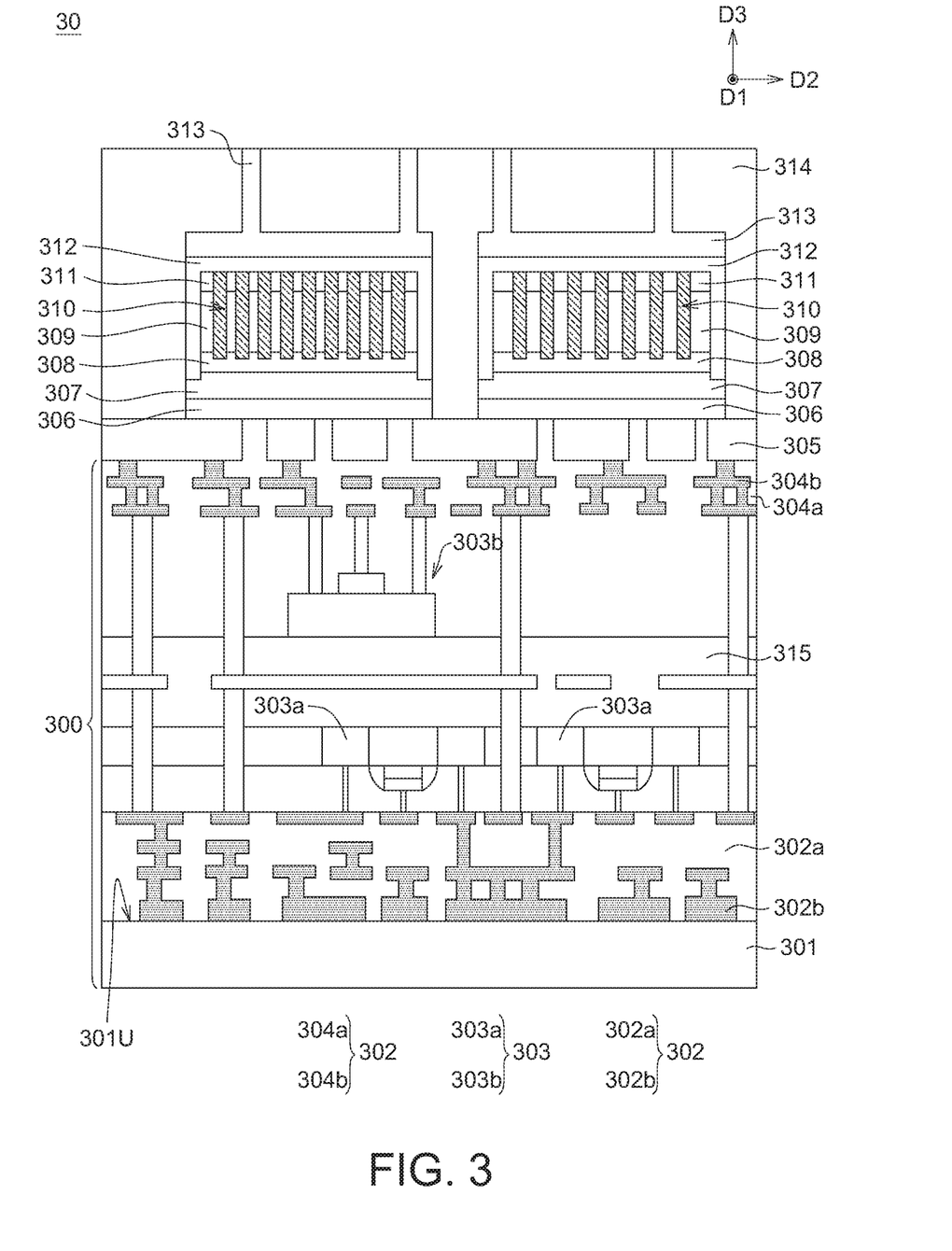
FIG. 3 illustrates a schematic view of a semiconductor module according to another embodiment of the present disclosure.

FIG. 3 illustrates a schematic view of a semiconductor module 30 according to another embodiment of the present disclosure. The structure of the semiconductor module 30 is substantially similar to that of the semiconductor module 10; the difference between them is that a semiconductor element 303 shown in FIG. 3 may include a gallium nitride (GaN) based device and a radio frequency-silicon on Insulator (RF-SOI) device, and a shielding structure 307 of the semiconductor module 30 is different from the shielding structure 107 of the semiconductor module 10.

In this embodiment, the semiconductor module 30 includes a substrate 300, the shielding structure 307 and a piezoelectric layer 309. The substrate 300 includes a supporting piece 301, a first circuit layer 302 and the semiconductor element 303. The shielding structure 307 is formed on the semiconductor element 303. The piezoelectric layer 309 is formed on the shielding structure 307.

The first circuit layer 302 is formed on an upper surface 301U of the supporting piece 301, and including an interlayer dielectric material 302a and a metal interconnection 302b. The semiconductor element 303 includes two RF-SOI devices 303a and a GaN based device 303b. The RF-SOI devices 303a are disposed above the first circuit layer 302. The GaN based device 303b is disposed above the RF-SOI devices 303a. The semiconductor module 30 may include a dielectric buffer layer 315 between the RF-SOI devices 303a and the GaN based device 303b.

The semiconductor module 30 may include a second circuit layer 304 and a metal layer 305 disposed between the shielding structure 307 and the semiconductor element 303. The metal layer 305 may be a metal pad with a thickness in the nanoscale. In an embodiment, the metal layer 305 may have a thickness ranging from 0.5 micrometers to 1 millimeters. The second circuit layer 304 may be disposed between the metal layer 305 and the semiconductor element 303 so as to provide electrical connections between the metal layer 305 and the semiconductor element 303. In an embodiment, the second circuit layer 304 is similar to the first circuit layer 302. The second circuit layer 304 may include an interlayer dielectric material 304a and a metal interconnection 304b. In another embodiment, the second circuit layer 304 may include a redistribution layer.

The present disclose is not intended to limit the material of the shielding structure 307. In an embodiment, the shielding structure 307 may include a dielectric material or a magnetic material. For example, the magnetic material may include ferrite, soft magnetic material, SIN, a low dielectric constant material, $HfO_x$, $SiO_2$, AlN, $Al_2O_3$, ZnO, lead zirconate titanate (PZT), $LiTaO_3$, $LiNbO_3$ or $Fe_3O_4$.

In this embodiment, the shielding structure 307 may have a single layer structure with a gradient density. Specifically, the shielding structure 307 has a density that gradually becomes larger or smaller along the stack direction of the supporting piece 301, the first circuit layer 302, the semiconductor element 303, the shielding structure 307, and the piezoelectric layer 309. The stack direction of the supporting piece 301, the first circuit layer 302, the semiconductor element 303, the shielding structure 307, and the piezoelectric layer 309 may also be understood as the third direction D3. In an embodiment, along the stack direction, the density of the shielding structure 307 decreases as the distance away from the piezoelectric layer 309 increases. In another embodiment, along the stack direction, the density of the shielding structure 307 decreases as the distance away from the piezoelectric layer 309 decreases.

In an embodiment, the semiconductor module 30 may include a first buffer layer 306 disposed between the metal layer 305 and the shielding structure 307. In other words, the first buffer layer 306 is formed between the shielding structure 307 and the semiconductor element 303. The first buffer layer 306 may include, but not limited to, oxide, nitrogen oxide or carbon nitride. The first buffer layer 306 may increase the heat dissipation efficiency of the semiconductor module 30, and improve the interfacial compatibility between the metal layer 305 and the shielding structure 307 so that the metal layer 305 and the shielding structure 307 can be connected stably to each other.

The piezoelectric layer 309 may be formed on the shielding structure 307, and the piezoelectric layer 309 and the semiconductor element 303 may be disposed on opposite sides of the shielding structure 307. The piezoelectric layer 309 may be made of a piezoelectric material. In this embodiment, the piezoelectric layer 309 is formed on the shielding structure 307 directly without using an additional bonding process to accomplish the connection between the piezoelectric layer 309 and the shielding structure 307. Therefore, the reliability of the semiconductor module 30 will not be decreased due to poor alignment accuracy or unstable quality of the bonding wires, and the controllability of the piezoelectric layer 309 can also be increased.

The semiconductor module 30 may include a conductive structure 310 embedded in the piezoelectric layer 309. In this embodiment, the conductive structure 310 is the same as the conductive structure 110 shown in FIGS. 1 and 2, that is, the conductive structure 310 includes at least one set of the interdigitated electrodes 210/211 disposed in the piezoelectric layer 309. The interdigitated electrodes 210/211 of the conductive structure 310 may form an interdigital transducer (IDT).

The semiconductor module 30 may include a second buffer layer 308, a first protecting layer 311, a second protecting layer 312 and an oxide structure 313. The second buffer layer 308 is disposed between the shielding structure 307 and the piezoelectric layer 309, and the first buffer layer 306 and the second buffer layer 308 are disposed on opposite sides of the shielding structure 307. The first protecting layer 311 is disposed on the piezoelectric layer 309. The second protecting layer 312 is disposed on the first protecting layer 311, and covering sidewalls of the shielding structure 307, the first protecting layer 311, the piezoelectric layer 309 and the second buffer layer 308. The oxide structure 313 is disposed on the second protecting layer 312.

The second buffer layer 308 may include, but not limited to, oxide, nitrogen oxide or carbon nitride. The second buffer layer 308 may absorb the electromagnetic wave in the semiconductor module 30 and improve the interfacial compatibility the shielding structure 307 and the piezoelectric layer 309 so that the shielding structure 307 and the piezoelectric layer 309 can be connected stably to each other. The first protecting layer 311 and the second protecting layer 312 may increase the stiffness of the semiconductor module 30.

The semiconductor module 30 may include a contact structure 314 disposed on an upper surface of the metal layer 305 so as to provide electrical connections between the metal layer 305 and other circuits or elements (not shown).

Figure 4A:
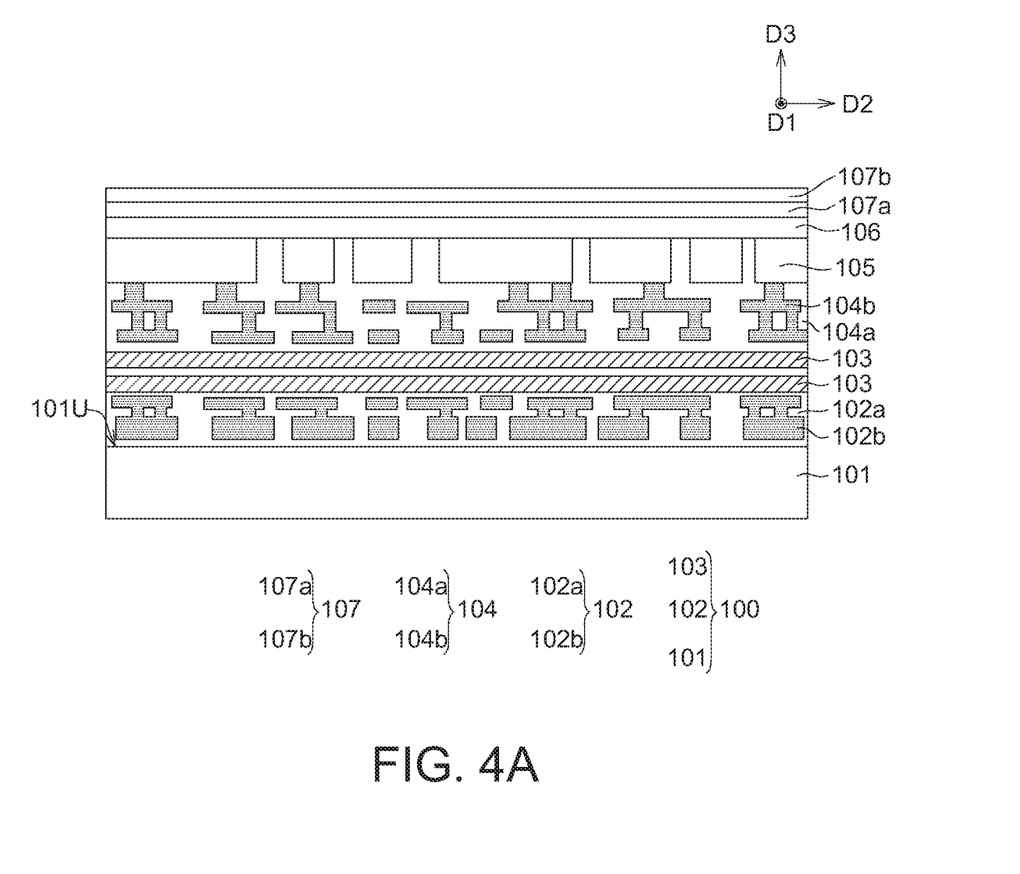
FIGS. 4A-4E illustrate a method for manufacturing a semiconductor module according to an embodiment of the present disclosure.

FIGS. 4A-4E illustrate a method for manufacturing a semiconductor module according to an embodiment of the present disclosure. FIGS. 4A-4E illustrate schematic sectional views of the semiconductor module 10 in the manufacturing process. The method includes the following steps:

Referring to FIG. 4A, a substrate 100 is provided. The substrate 100 includes a supporting piece 101, a first circuit layer 102 and semiconductor elements 103. The semiconductor elements 103 are formed on the upper surface 101U of the supporting piece 101. The first circuit layer 102 is disposed between the semiconductor elements 103 and the upper surface 101U of the supporting piece 101 so as to provide electrical connections between the semiconductor elements 103 and the supporting piece 101. The first circuit layer 102 may include an interlayer dielectric material 102a and a metal interconnection 102b. In an embodiment, providing the substrate 100 may include depositing the interlayer dielectric material 102a and the metal interconnection 102b on the upper surface 101U of the supporting piece 101 according to a circuit layout to form the first circuit layer 102.

Then, a second circuit layer 104 is formed on an upper surface of the semiconductor elements 103. In an embodiment, the second circuit layer 104 is similar to the first circuit layer 102. The second circuit layer 104 may include an interlayer dielectric material 104a and a metal interconnection 104b. In an embodiment, the interlayer dielectric material 104a and the metal interconnection 104b may be deposited on the upper surface 101U of the supporting piece 101 according to a circuit layout to form the second circuit layer 104. Then, a metal layer 105 is formed on the second circuit layer 104. The second circuit layer 104 is disposed between the metal layer 105 and the semiconductor elements 103. In an embodiment, the metal layer 105 may be deposited on the second circuit layer 104.

A first buffer layer 106 is formed on an upper surface of the metal layer 105. Then, a shielding structure 107 is formed on an upper surface of the first buffer layer 106. In an embodiment, the first buffer layer 106 may be deposited on the upper surface of the metal layer 105, and the shielding structure 107 may be deposited on the upper surface of the first buffer layer 106.

In an embodiment, forming the shielding structure 107 may include forming a first shielding layer 107a and a second shielding layer 107b. Specifically, forming the shielding structure 107 may include the following step: forming the first shielding layer 107a having a first density, wherein the first shielding layer 107a is stacked on the semiconductor elements 103; forming the second shielding layer 107b having a second density, wherein the second shielding layer 107b is stacked on the first shielding layer 107a. In an embodiment, the first shielding layer 107a and the second shielding layer 107b may be formed on the first buffer layer 106 sequentially, for example, by a deposition process. In another embodiment, the shielding structure 107 including the first shielding layer 107a and the second shielding layer 107b may be formed in another process, and then the shielding structure 107 including the first shielding layer 107a and the second shielding layer 107b is connected with the first buffer layer 106 using bonding technology.

Figure 4B:
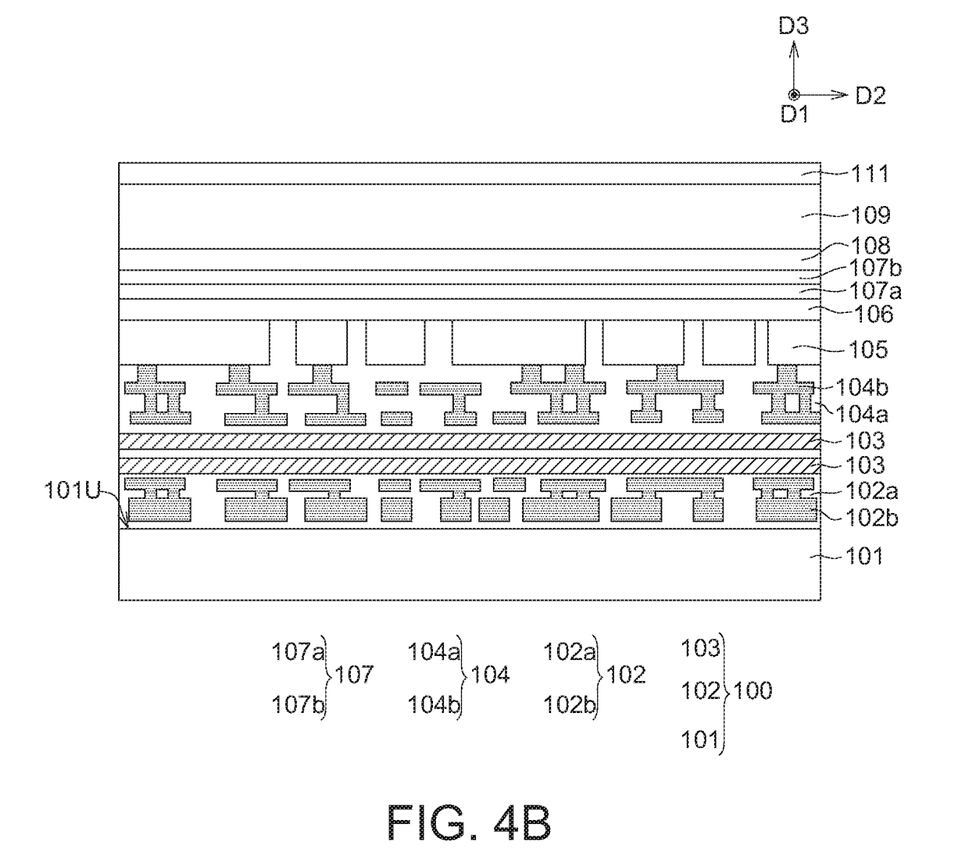

Referring to FIG. 4B. After the forming of the shielding structure 107, a second buffer layer 108 is formed on an upper surface of the shielding structure 107, a piezoelectric layer 109 is formed on an upper surface of the second buffer layer 108, and then a first protecting layer 111 is formed on an upper surface of the piezoelectric layer 109. In an embodiment, the second buffer layer 108, the piezoelectric layer 109 and the first protecting layer 111 may be formed by deposition processes or bonding technology.

Figure 4C:
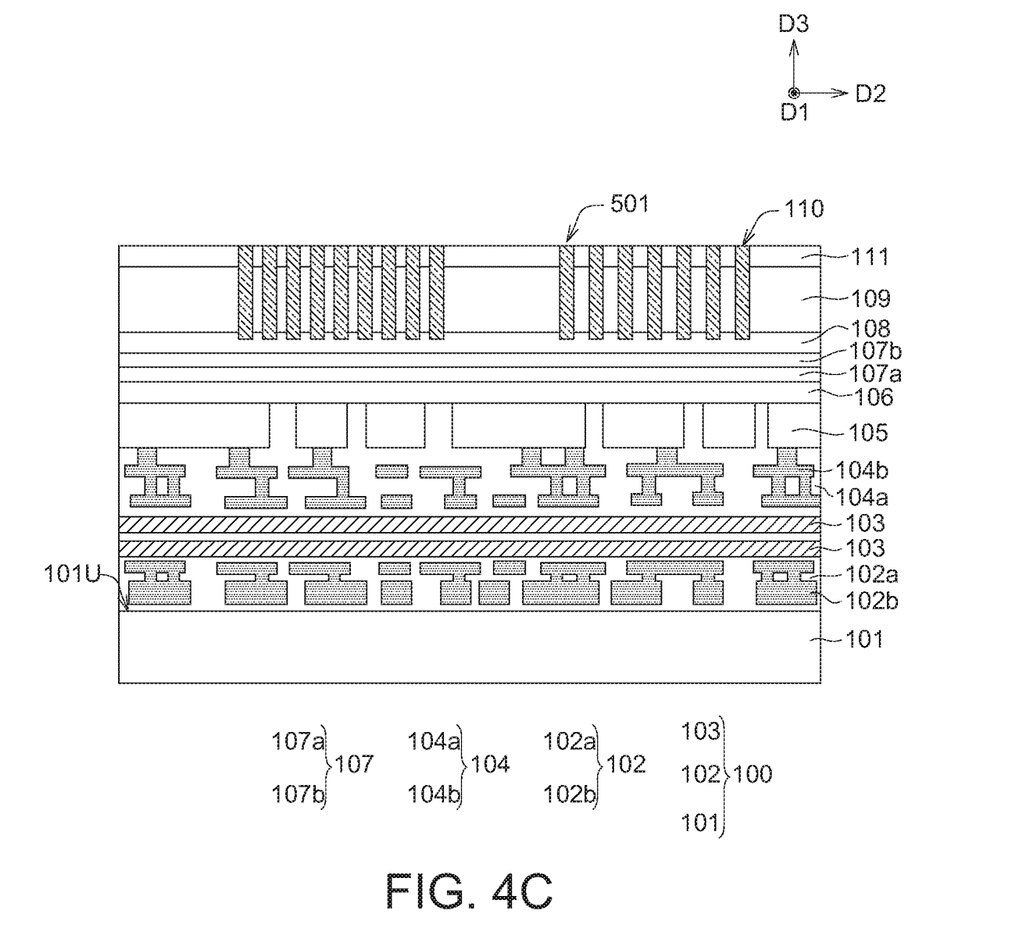

Referring to FIG. 4C, a conductive structure 110 is then formed to pass through the piezoelectric layer 109. In an embodiment, a portion of the second buffer layer 108, the piezoelectric layer 109 and the first protecting layer 111 is removed to formed first openings 501, wherein the first openings 501 expose the second buffer layer 108; a conductive material is then deposited in the first openings 501 to form the conductive structure 110. In an embodiment, a portion of the second buffer layer 108, the piezoelectric layer 109 and the first protecting layer 111 may be removed by an etching process.

Figure 4D:
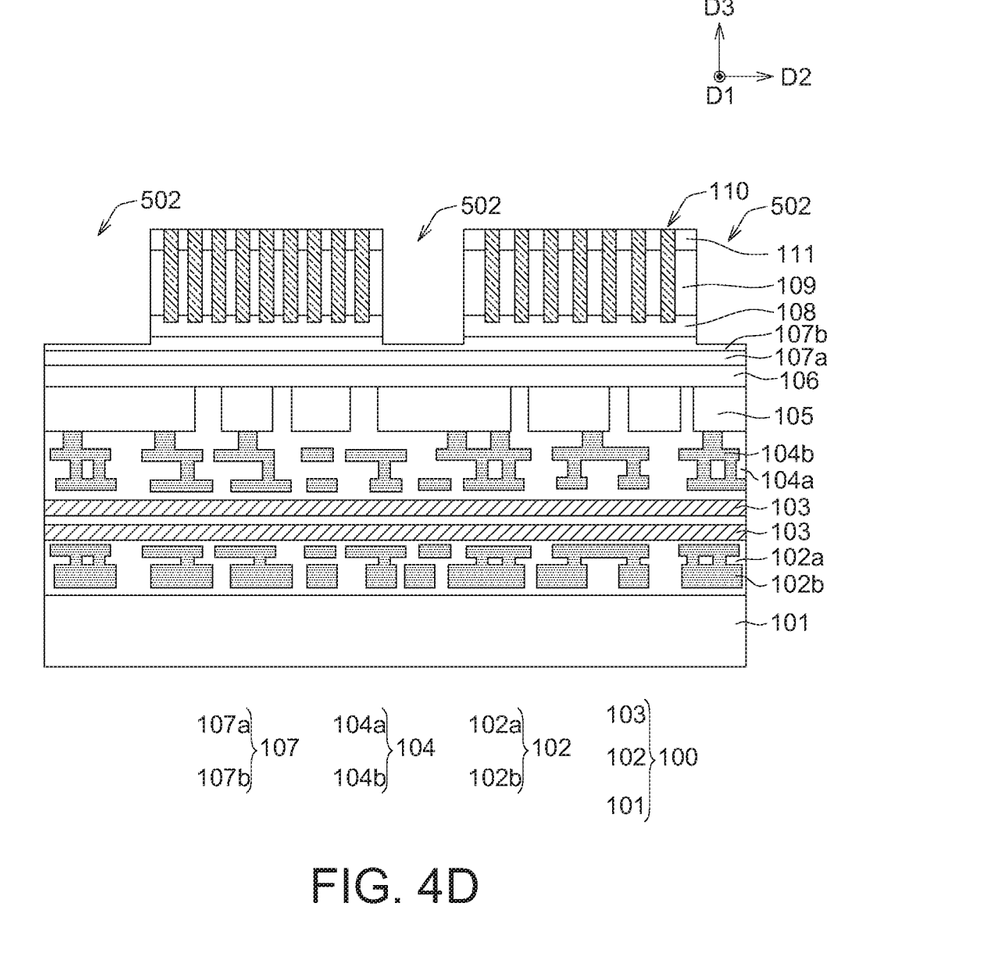

Referring to FIG. 4D, a portion of the shielding structure 107, the second buffer layer 108, the piezoelectric layer 109 and the first protecting layer 111 is removed to form second openings 502. The second openings 502 expose sidewalls of the second buffer layer 108, the piezoelectric layer 109 and the first protecting layer 111. The second openings 502 expose the shielding structure 107. In an embodiment, the second openings 502 expose part of sidewalls of the shielding structure 107. In an embodiment, a portion of the shielding structure 107, the second buffer layer 108, the piezoelectric layer 109 and the first protecting layer 111 may be removed by an etching process.

Figure 4E:
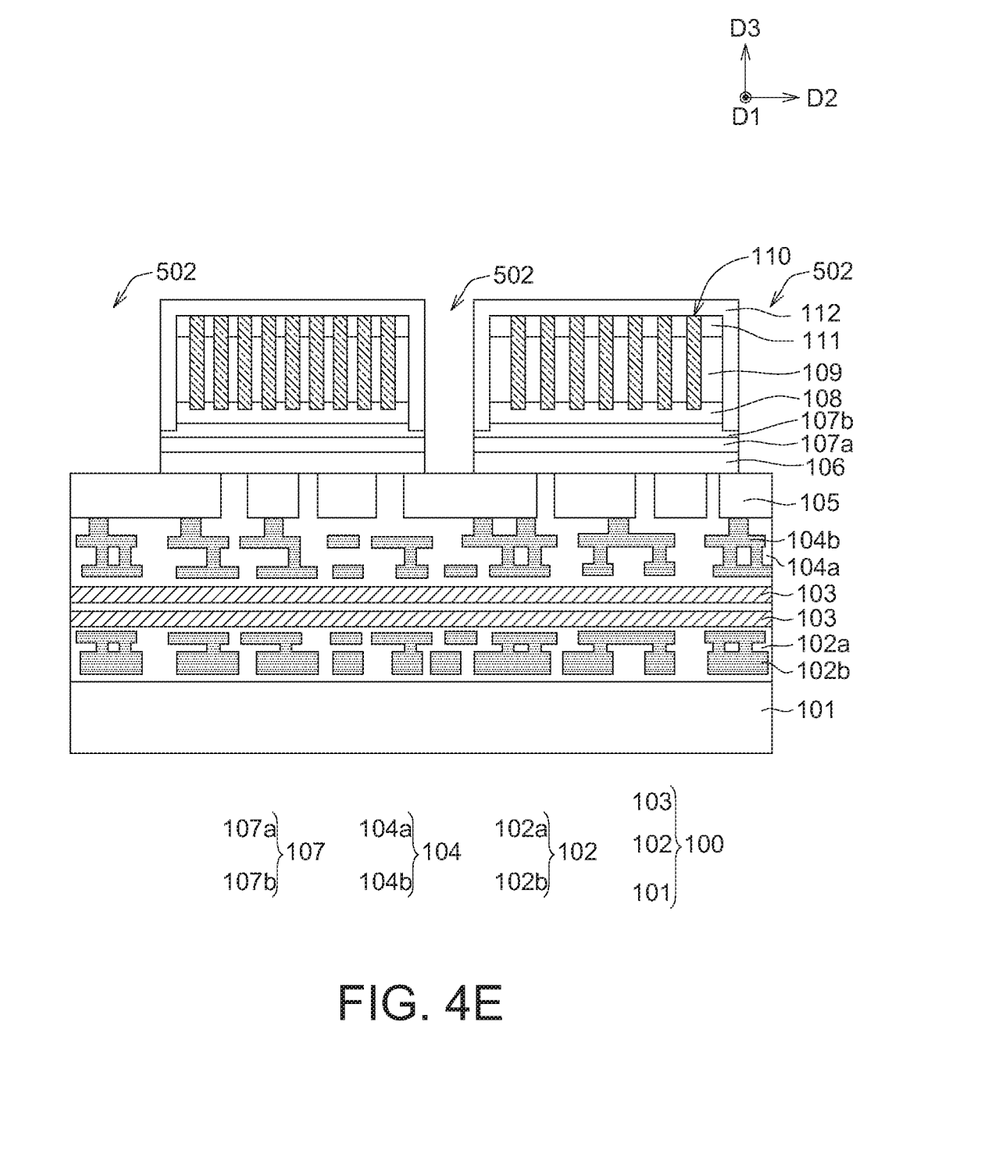

Referring to FIG. 4E, a second protecting layer 112 is formed on sidewalls of the second openings 502, bottoms of the second openings 502 and an upper surface of the first protecting layer 111 after the processing stage shown in FIG. 4D. The second protecting layer 112 covers the conductive structure 110. The second protecting layer 112 on the bottoms of the second openings 502, the shielding structure 107 and the first buffer layer 106 is then removed to expose the metal layer 105. In an embodiment, the removing step may be performed by an etching process.

After the processing stage shown in FIG. 4E, an oxide structure 113 and a contact structure 114 may be formed to form the semiconductor module shown in FIG. 1.

In the conventional semiconductor module, a filter is manufactured in advance, and then the filter is mounted on a front end module of the conventional semiconductor module using an additional bonding process. In contrast to the conventional semiconductor module, in the present disclosure, a shielding structure is formed on a front end module, and a piezoelectric structure is directly formed on the shielding structure using, for example, a deposition process or bonding technology afterwards; then, performing a back end of line (BEOL) process to form one or more SAW filter. As such, the present disclosure can avoid the problems of alignment accuracy and unstable quality of bonding wires resulting from additional bonding processes. In addition, without additional bonding processes, the SAW filter of the semiconductor module provided by the present disclosure can be well controlled, the integration and performance of the semiconductor module provided by the present disclosure can be increased, and the production cost can be reduced.

It is noted that the structures and methods as described above are provided for illustration. The disclosure is not limited to the configurations and procedures disclosed above. Other embodiments with different configurations of known elements can be applicable, and the exemplified structures could be adjusted and changed based on the actual needs of the practical applications. It is, of course, noted that the configurations of figures are depicted only for demonstration, not for limitation. Thus, it is known by people skilled in the art that the related elements and layers in a semiconductor module, the shapes or positional relationship of the elements and the procedure details could be adjusted or changed according to the actual requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor module, comprising:
a substrate comprising a front side and at least one semiconductor element formed on the front side;
a shielding structure formed on the at least one semiconductor element and comprising a first shielding layer and a second shielding layer;
a piezoelectric layer formed on the shielding structure;
a buffer layer formed between the shielding structure and the piezoelectric layer;
a conductive structure embedded in the piezoelectric layer; and
a protecting layer formed on an upper surface of the piezoelectric layer, a sidewall of the piezoelectric layer, a sidewall of the buffer layer,
wherein the first shielding layer and the buffer layer are on opposite sides of the second shielding layer,
lower ends of the conductive structure are between a lower surface of the piezoelectric layer and the second shielding layer, a lower end of the protecting layer is in the second shielding layer, the shielding structure comprises a magnetic material.

2. The semiconductor module according to claim 1, wherein the first shielding layer has a first density, the second shielding layer has a second density, the first density is greater than the second density.

3. The semiconductor module according to claim 1, wherein the first shielding layer has a first density, the second shielding layer has a second density, the first density is less than the second density.

4. The semiconductor module according to claim 1, wherein the shielding structure has a gradient density.

5. The semiconductor module according to claim 4, wherein the gradient density decreases along a direction away from the piezoelectric layer.

6. The semiconductor module according to claim 4, wherein the gradient density increases along a direction away from the piezoelectric layer.

7. The semiconductor module according to claim 1, further comprising another buffer layer formed between the first shielding layer and the at least one semiconductor element.

8. The semiconductor module according to claim 1, wherein the conductive structure comprises an interdigital transducer (IDT).

9. The semiconductor module according to claim 1, wherein the at least one semiconductor element comprises a gallium nitride (GaN) based device and a radio frequency-silicon on Insulator (RF-SOI) device.

10. The semiconductor module according to claim 1, wherein the at least one semiconductor element comprises a temperature detecting circuit.

11. The semiconductor module according to claim 1, wherein the at least one semiconductor element comprises a front end module (FEM).

* * * * *